United States Patent [19]

Flükiger

[11] 4,402,768
[45] Sep. 6, 1983

[54] METHOD FOR PRODUCING SUPERCONDUCTIVE WIRES OF MULTIFILAMENTS WHICH ARE ENCASED IN COPPER OR A COPPER ALLOY AND CONTAIN NIOBIUM AND ALUMINUM

[75] Inventor: Rene Flükiger, Karlsruhe-Waldstadt, Fed. Rep. of Germany

[73] Assignee: Kernforschungszentrum Karlsruhe GmbH, Karlsruhe, Fed. Rep. of Germany

[21] Appl. No.: 265,573

[22] Filed: May 20, 1981

[30] Foreign Application Priority Data

May 24, 1980 [DE] Fed. Rep. of Germany ....... 3019980

[51] Int. Cl.$^3$ .......................................... H01L 39/00
[52] U.S. Cl. .............................. 148/11.5 F; 29/599; 148/11.5 P; 148/11.5 Q
[58] Field of Search ...................... 148/11.5 R, 11.5 F, 148/11.5 Q, 11.5 P, 127, 133; 428/930; 29/599; 75/174

[56] References Cited

U.S. PATENT DOCUMENTS

| | | |
|---|---|---|
| 3,884,683 | 5/1975 | Kawabe et al. ..................... 148/133 |
| 3,887,364 | 6/1975 | Kawabe et al. ..................... 148/133 |
| 4,050,147 | 9/1977 | Winter et al. ........................ 29/599 |
| 4,073,666 | 2/1978 | Marancik et al. ............. 148/11.5 R |
| 4,109,374 | 8/1978 | Whetstone et al. ................. 29/599 |
| 4,177,087 | 12/1979 | Lee et al. ....................... 148/11.5 R |
| 4,223,434 | 9/1980 | Wang et al. .................... 148/11.5 P |

FOREIGN PATENT DOCUMENTS 1335532 10/1973 United Kingdom ........... 148/11.5 P

OTHER PUBLICATIONS

Akihama et al., "Fabrication of Multifilamentary Nb-Al By a Powder Metallurgy Process", IEEE Trans. on Magnetics, vol. Mag-17, No. 1, Jan. 1981, pp. 274-277.

Flükiger et al., "Fabrication on a Laboratory Scale and Mechanical Properties of Cu-Nb-Sn Multifilamentary Superconducting Composite Wires Produded by Cold Powder Metallurgy Processing", Appl. Phys. Lett. 35(10), Nov. 15, 1979, pp. 810-812.

Roberge et al., "In Situ and Powder Metallurgy Multifilamentary Superconductors: Fabrication and Properties", *Filamentary A15 Superconductors*, Plenum Press, N.Y., 1980, pp. 241-257.

Ceresara et al., "Practical Nb$_3$Al Wires: Experimental Behavior of Small Scale Solenoids", IEEE Transactions on Magnetics, vol. Mag. 15, Jan. 1979, pp. 639-641.

Larson et al., "Mechanically Alloyed Superconducting Compounds", Proceedings of International Conference, Nov. 8-10, 1976, Port Chester, N.Y., (1977), pp. 155-163.

*Primary Examiner*—Peter K. Skiff
*Attorney, Agent, or Firm*—Spencer & Kaye

[57] ABSTRACT

A method for producing a superconductive wire of multifilaments having components comprising niobium and aluminum encased in copper or a copper alloy, wherein the multifilament configuration and the formation of a superconductive A15 phase are positively developed from the components disposed in a copper or copper alloy tube having an interior metallic coating serving as a diffusion barrier, by cold forming and subsequent heat treatment.

16 Claims, No Drawings

METHOD FOR PRODUCING SUPERCONDUCTIVE WIRES OF MULTIFILAMENTS WHICH ARE ENCASED IN COPPER OR A COPPER ALLOY AND CONTAIN NIOBIUM AND ALUMINUM

BACKGROUND OF THE INVENTION

The present invention relates to a method for producing superconductive wires of multifilaments which are encased in copper or a copper alloy and contain niobium and aluminum.

The basic structure of superconductive, copper stabilized Nb₃Al wires utilized in the past has been a pure copper matrix in which a plurality of Nb₃Al filaments (7 or 19) was embedded (See Ceresara et al, IEEE Transactions of Magnetics, Volume. MAG-15, No. 1, January, 1979, pages 639 to 641). In this structure, each filament was produced according to the so-called "Swiss roll" or "French roll" in which thin foils of niobium and aluminum are alternatingly tightly wound around a copper cylinder and the total structure is drawn in the direction of the roll axis into thin wires having a diameter of about 0.2 mm. Seven or nineteen of such wires are inserted into corresponding bores of a larger copper cylinder and the entire unit is drawn again until a final outer diameter of about 0.45 mm is obtained.

The final heat treatment to form the Al5 compound Nb₃Al is effected at a temperature of about 1173° K. By producing wires in this manner, it is possible to achieve a critical current density on the order of magnitude of $2 \times 10^5$ A/cm² at 64 kG and a transition temperature near 16° K.

However, this process has serious disadvantages in that it involves a very complicated technique, and requires very thin aluminum and niobium foils whose dimensions are limited by the manufacturing process itself. Moreover, due to the helical geometry of the bands which are processed into wire, the coils constructed for superconductive magnets will most likely require long excitation periods.

It has also been proposed to bring niobium and aluminum powder into very intimate, mechanical contact in a high energy ball mill by using heavy balls, thus causing, in the course of the process, the powder particles to be quasi-welded together and, further causing the existing or resulting particles to be broken up or to be comminuted. See Larson et al., Manufacture of Superconducting Materials, Proc. of an International Conf., Nov. 8–10, 1976, Port Chester, N.Y. (1977) pp. 155–163. It has been found that the effective thickness of these treated powders is reduced and the process continued until the particle size and/or thickness fall substantially below 1 micron. Thereafter, the alloy powder is packed into a tantalum tube for the production of wire, the tantalum tube is inserted into a copper tube and its entire unit is drawn into a wire. The Al5 phase is realized by heating the alloy powder to 1123° K.

With this process, called "mechanical alloying," the niobium particles are deformed to a great and uncontrollable (localized) extent. Thus, these particles are damaged and become very hard, and therefor, no wire of kilometer length can be produced from this material without the occurrence of breaks.

In the past, only Nb₃Sn wires could be used for the production of superconductive magnets up to 15 tesla while V₃Ga, which can be used for higher telsa values, is uneconomical for the production of large superconductive magnets due to its gallium component and the high manufacturing costs connected therewith.

SUMMARY OF THE INVENTION

It is an object of the present invention to provide a simple method for producing Cu-Nb₃Al multicore superconductors having high critical current densities.

It is a further object of the present invention to provide a method for the production of superconductive wires which have material properties improved to such an extent that superconductive magnets having fields of more than 15 tesla can be produced therefrom in industry.

To achieve these objects, and in accordance with its purpose, the present invention provides a method for producing a superconductive wire of multifilaments having components comprising niobium and aluminum encased in copper or a copper alloy, wherein the multifilament configuration and the formation of a superconductive Al5 phase are positively developed from the components disposed in a copper or copper alloy tube having an interior metallic coating serving as a diffusion barrier, by cold forming and subsequent heat treatment, comprising the steps of:

(a) mixing to form a powder mixture, either (a₁) niobium powder and aluminum powder, each having a grain diameter range between 1 and 400 microns, in proportions suitable to form an Al5 compound of the composition x% by weight Al and (100-x)% by weight Nb, wherein $5 \leq x \leq 20$; or (a₂) niobium powder, aluminum powder and copper powder, each having a grain diameter range between 1 and 400 microns, in proportions of Al, Nb and Cu such that after diffusion of the Al into the Cu, there is a sufficient quantity of Al for the formation of an Al5 compound of the composition x% by weight Al and (100-x)% by weight Nb, wherein $5 \leq x \leq 20$;

(b) pressing the powder mixture into a tube formed of copper or a copper alloy having a greater hardness and higher mechanical tensile strength than copper, the interior of the tube having a diffusion barrier in the form of a coating of Ta or Ni of a thickness which is about 0.1 to 0.25 times the thickness of the tube, to form a filled tube;

(c) cold forming the filled tube into wire comprising niobium filaments by swaging and drawing into wire, or by hydrostatic extrusion, swaging, and drawing into fine wire, wherein (c₁) the desired wire diameter is $>0.1$ mm, and the cold forming takes place until the diameter D of the niobium filament produced during cold forming is 0.1 microns $\leq D \leq 1$ micron; or (c₂) the desired wire diameter is $\leq 0.1$ mm, and the cold forming is interrupted by a one time or multiple bundling of a plurality of already partially deformed wires, and the bundle of wires is then cold formed; and (d) annealing the wire at a temperature in the range between 923° and 1173° K.

It is to be understood that both the foregoing general description and the following detailed description are exemplary, but are not restrictive of the invention.

DETAILED DESCRIPTION OF THE INVENTION

In the first process step of the present invention, niobium and aluminum powders, and optionally copper powder, are mixed in proportions such that a superconducting A15 compound may form having a composition, by weight, of x% Al and (100-x)% Nb, where $5 \leq X \leq 20$. This weight precentage of aluminum corresponds to 18 to 25 atom % Al in thermal equilibrium, so that the resulting intermetallic compound between Nb and Al crystallizes in the A15 phase characterised by $Nb_3Al$. The grain diameters of the powders used are in the range between 1 and 400 microns.

When niobium, aluminum and copper powders are mixed, part of the Al powder diffuses into the Cu and is made unavailable for reaction with Nb powder during the subsequent heat treatment. Therefore, sufficient aluminum must be present so that after diffusion, there is enough free to react with the Nb to form a superconducting A15 compound having a composition, by weight, of x% Al and (100-x)% Nb, where $5 \leq X \leq 20$. This behavior of the Al-Nb-Cu system is contrary to the behavior of the Sn-Nb-Cu system, where the tin is able to separate during the heat treatment from an initially formed bronze, and to form the desired A15 compound $Nb_3Sn$ with niobium.

Accordingly, when Al, Nb and Cu powders are mixed, they are generaly mixed in quantities, by weight, of 30 to 70% Cu, 15 to 32% Nb and 2 to 10% Al.

According to an advantageous embodiment of the present invention, 5 to 20% by weight of the aluminum powder is replaced by at least one of the powders of beryllium, boron, gallium and arsenic. Alternatively, 5 to 20% by weight of the aluminum powder may be replaced by at least one of the powders of magnesium, tin and antimony. These advantageous embodiments enhance the later formation of $Nb_3Al$. This enhanced formation of $Nb_3Al$ results in higher transition temperatures, for example, 16.3° K.

In the second step of the invention, the powder mixture thus formed is pressed into a tube. The tube is made of copper or of a copper alloy having a greater hardness and a higher mechanical tensile strength than copper. This copper alloy may comprise zirconium, silicon, beryllium, or a copper-$Al_2O_3$ alloy. The copper-$Al_2O_3$ alloy is dispersion hardened by the $Al_2O_3$ which is in the form of inclusions.

The copper or copper alloy tube is provided with a diffusion barrier in the form of a coating of Ta or Ni which has a thickness of about 0.1 to 0.25 times the thickness of the tube wall.

In an advantageous embodiment of the present invention, the diameter and wall thickness of the interior coated tube are selected to correspond to the formula $R_f = 20\text{-}30\% \; P_f$ where $R_f$ is the cross sectional area of the tube wall including the diffusion barrier coating and $P_f$ is the cross sectional area of the opening in the tube for the powder mixture, these areas being measured perpendicular to the longitudinal direction.

The filled tube is then transformed into wire in a third, cold forming step. During the cold forming process, in which the niobium particles are deformed into fragments having diameters less than 1 micron, no chemical reaction takes place. The essential requirement of the process is that the deformation is continued until the diameter of the niobium filaments produced is about 0.1 to 1 micron, preferably 0.1 to 0.3 micron. When the desired final diameter of the wire is greater than 0.1 mm, the cold forming process is not any more interrupted by a bundling operation.

The cold forming process may be interrupted by a one-time or multiple bundling of a plurality of already partially deformed wires, followed by continued cold-forming of the bundle of wires. The bundling process is known to the art. Additional bundling is especially important where the desired final diameter of the wire is equal to or less than 0.1 mm.

The cold forming process is typically carried out by swaging and drawing into wire or by hydrostatic extrusion, swaging and drawing into fine wire. (Hydrostatic extrusion is a conventional technique).

The final process step is a heat treatment or annealing during which the A15 phase is formed. Times and temperatures for the heat treatment may vary, for example, from several days at 1073° K. to several hours at 1123° K. to several minutes at 1173° K. Transition temperature $T_c$ values are known to depend on heat treatment conditions, and vary between about 12° and 16° K. The lower $T_c$ value here corresponds to the equilibrium value in which the A15 phase contains 20-21 atom % Al, while the upper $T_c$ value clearly corresponds to a non-equilibrium value, in which the A15 phase contains about 22 atom % Al. The higher $T_c$ value is responsible for the high critical current density $J_c$ values, for example, $J_c = 2 \times 10^5$ A/cm² at 6.4 tesla. The equilibrium value of $T_c$ after the appropriate reaction temperature corresponds to that Al content which is obtained following the equilibrium phase diagram.

In the further embodiment of the invention, the heat treatment of the wire if effected initially in order to form the A15 phase, as noted above, for a period of several days to several minutes, at a temperature of 973° to 1173° K. Thereafter, the wire is heat treated for a period of one to six weeks at a temperature of 923° to 973° K., in order to increase the superconducting transition temperature and the critical current density.

The very simple process according to the present invention permits the production of large quantities of superconductive wires having relatively high $J_c$ values so that it is possible to manufacture superconductive coils which are capable of producing magnetic fields $B_o$ of greater than 15 tesla.

The following examples are given by way of illustration to further explain the principles of the invention. These examples are merely illustrative and are not to be understood as limiting the scope and underlying principles of the invention in any way. All percentages referred to herein are by weight unless otherwise indicated.

EXAMPLE 1

Nb and Al powders, having a particle size of <40 microns, were mixed in a ratio of 3:1, placed into an interiorly coated tube of a Cu 1.8 wt% Be alloy having a diameter of 12/10 mm (outer/inner), and the entire unit was drawn into wire until it reached an external diameter of 0.6 mm. Then wires produced in this manner were packed (bundled) into an uncoated Cu tube having a diameter of 12/10 mm (about 200 pieces) and the tube was drawn to about 0.1 mm. (Deformation process stopped at 0.1 mm). The initial coating of the tube had an initial thickness of 0.1 mm.

The heat treatment of the wire took place for 6 hours at 1123° K. The onset of superconduction of this sample was measured at 15.8° K. This value corresponds to that of Ceresara as well as to that of Larson et al.

The $J_c$ values measured in nonoptimized wires are comparable with those in the literature and lie even higher. Nonoptimized means that no systematic investigation was done for determining the highest possible critical current value in this wire. The measured value of $J_c$ was $3 \times 10^4$ A/cm² at 10 T compared to $5 \times 10^4$ A/cm² at 8 T of prior art.

Swaging is necessary if the length of the Nb filaments is less than 2 mm. In the other cases, it is only needed for reducing the end of the wire introducing in the drawing die.

Preliminary tests with hydrostatic extrusion evidence an even better formation of the Nb filaments.

EXAMPLE 2

The procedure described in Example 1 was repeated with the exception that Ga powder was added to the Al and pulverized at the temperature of liquid nitrogen. Ga:Al = 1:4.

Also, before pressing the powder into the tube and before the heat treatment reaction in the tube, a heat treatment was effected at 473° K., in order to permit the Ga and Al to react. Ga becomes liquid at 302° K., and the presence of liquid Ga during drawing would cause the wire to break.

The reaction heat treatment was 24 hours at 1023° K. and 6 hours at 1123° K. The measured $T_c$ value of 16.3° K. was higher than any comparable value according to the prior art. The onset $T_c$ value of prior art was 15.8° K.

It will be understood that the above description of the present invention is susceptible to various modifications, changes and adaptions, and the same are intended to be comprehended within the meaning and range of equivalents of the appended claims.

What is claimed is:

1. A method for producing a superconductive wire of multifilaments having components comprising niobium and aluminum encased in copper or a copper alloy, wherein the multifilament configuration and the formation of a superconductive A15 phase are positively developed from the components disposed in a copper or copper alloy tube having an interior metallic coating serving as a diffusion barrier, by cold forming and subsequent heat treatment, comprising the steps of:

(a) mixing to form a powder mixture, niobium powder and aluminum powder, each havng a grain diameter between 1 and 400 microns, in proportions suitable to form an A15 compound of the composition x% by weight Al and (100-x)% by weight Nb, wherein $5 \leq x \leq 20$;

(b) pressing said powder mixture into a tube formed of copper or a copper alloy having a greater hardness and higher mechanical tensile strength than copper, the interior of the tube having a diffusion barrier in the form of a coating of Ta or Ni of a thickness which is about 0.1 to 0.25 times the thickness of the tube, to form a filled tube;

(c) cold forming the filled tube into wire comprising niobium filaments by swaging and drawing into wire, or by hydrostatic extrusion, swaging, and drawing into fine wire, wherein the cold forming takes place until the diameter D of the niobium filaments produced during cold forming is 0.1 microns $\leq D \leq 1$ micron; and (d) annealing the wire at a temperature between 923° and 1173° K. to form the A15 phase.

2. Method according to claim 1, wherein said powder mixture additionally comprises copper powder, the proportions of Nb, Al and Cu being such that after diffusion of the Al into the Cu, there is a sufficient quantity of Al for the formation of said A15 compound.

3. Method according to claim 1, wherein the powder mixture does not contain copper powder.

4. Method according to claim 1, wherein the desired wire diameter is greater than 0.1 mm, and the cold forming is performed without interruption for bundling.

5. Method according to claim 1, wherein the desired wire diameter is equal to or less than 0.1 mm, and the cold forming is interrupted by a one time or multiple bundling of a plurality of already partially deformed wires, and the bundle of wires is then cold formed.

6. Method according to claim 2, 4, or 5, wherein the powders which are mixed to form the powder mixture comprise 30 to 70% by weight Cu, 15 to 32% by weight Nb, and 2 to 10% by weight Al.

7. Method according to claim 1, 2, 3, 4, or 5, wherein the diameter and wall thickness of the tube are selected to correspond to the formula $R_f = 20-30\% \ P_f$, where $R_f$ is the cross sectional area of the tube wall and $P_f$ is the cross sectional area of the opening in the tube for the powder mixture.

8. Method as defined in claim 1, 2, or 3, wherein the tube is of a copper alloy comprising zirconium.

9. Method as defined in claim 1, 2, or 3, wherein the tube is of a copper alloy comprising silicon.

10. Method according to claim 1, 2, or 3, wherein the tube is of a copper alloy comprising beryllium.

11. Method according to claim 1, 2, or 3, wherein the tube is of a copper alloy dispersion hardened with $Al_2O_3$ inclusions.

12. Method according to claim 1, 2, or 3, wherein the heat treatment is initially effected at a temperature of 923° to 1173° K. for a period of several minutes to several days to form the A15 phase, and is subsequently effected at a temperature of 923° K. to 973° K. for a period of one to six weeks in order to increase the superconducting transition temperature and critical current density.

13. Method according to claim 1, 2, or 3, wherein 5 to 20% by weight of the aluminum powder is replaced by at least one of the powders of beryllium, boron, gallium and arsenic.

14. Method according to claim 1, 2, or 3, wherein 5 to 20% by weight of the aluminum powder is replaced by at least one of the powders of magnesium, tin, and antimony.

15. Method according to claim 1, wherein 5 to 20% by weight of the aluminum powder is replaced by at least one of the powders of gallium and arsenic.

16. Method according to claim 1, wherein 5 to 20% by weight of the aluminum powder is replaced by at least one of the powders of magnesium and tin.

* * * * *